United States Patent [19]

Mautz et al.

[11] Patent Number: 5,476,816

[45] Date of Patent: Dec. 19, 1995

[54] PROCESS FOR ETCHING AN INSULATING LAYER AFTER A METAL ETCHING STEP

[75] Inventors: Karl E. Mautz, Austin; Jeffrey G. Cadenhead, Kyle; Thomas M. Allen; H. Adam Stevens, both of Austin, all of Tex.

[73] Assignee: Motorola, Inc., Schaumburg, Ill.

[21] Appl. No.: 219,123

[22] Filed: Mar. 28, 1994

[51] Int. Cl.$^6$ ................................. H01L 21/44
[52] U.S. Cl. .................. 437/195; 437/235; 156/653.1
[58] Field of Search ................................. 437/195, 235; 156/653.1; 148/DIG. 51

[56] References Cited

U.S. PATENT DOCUMENTS

| | | | |
|---|---|---|---|
| 3,917,491 | 11/1975 | Oswald, Jr. et al. | 148/1.5 |
| 4,087,367 | 5/1978 | Rioult et al. | 252/79.1 |
| 4,569,722 | 2/1986 | Maury et al. | 156/657 |
| 4,871,422 | 10/1989 | Scardera et al. | 156/662 |
| 4,921,572 | 5/1990 | Roche | 156/653 |
| 4,966,865 | 10/1990 | Welch et al. | 437/192 |
| 4,980,301 | 12/1990 | Harrus et al. | 437/190 |
| 5,169,408 | 12/1992 | Biggerstaff et al. | |
| 5,320,709 | 6/1994 | Bowden et al. | 156/667 |

FOREIGN PATENT DOCUMENTS

| | | |
|---|---|---|
| 0375255 | 6/1990 | European Pat. Off. . |
| 0485086 | 5/1992 | European Pat. Off. . |
| 249706 | 9/1987 | German Dem. Rep. . |

OTHER PUBLICATIONS

Lundquist, et al.; "Reliability improvement of integrated circuits through alkali ion . . . ;" SPIE; vol. 2334; pp. 252–257 (Oct. 20–21, '94).

Cadenhead, et al.; "Sodium Contamination Characterization Of Oxide And Aluminum Etching Rie Hexode Reactors;" Interconnection and Contract Metalization for ULSI; pp. 180–185 (1991).

Primary Examiner—George Fourson
Assistant Examiner—C. Everhart
Attorney, Agent, or Firm—George R. Meyer

[57] ABSTRACT

A metal etch processing sequence eliminates the need to use an organic masking layer solvent and etches a portion of an insulating layer after a plasma metal etching step. The etch of the insulating layer is performed with an etching solution that may include 1,2-ethanediol, hydrogen fluoride, and ammonium fluoride. The etching solution etches in a range of 100–900 angstroms of the insulating layer. The etch removes at least 75 percent of the mobile ions within the insulating layer, and should remove at least 95 percent of the mobile ions. The process may be implemented using an acid hood, an acid compatible spray tool, or a puddle processing tool. The process includes many different embodiments that allow the process to be easily integrated into many different existing processing sequences. A similar process may be used with a resist-etch-back processing sequence.

21 Claims, 5 Drawing Sheets

5,476,816

PROCESS FOR ETCHING AN INSULATING LAYER AFTER A METAL ETCHING STEP

FIELD OF THE INVENTION

The present invention relates to processes for forming semiconductor devices, and in particular, processes for forming insulating layers and interconnects in semiconductor devices.

BACKGROUND OF THE INVENTION

Interconnects allow various parts of a semiconductor device to be electrically connected with other parts of the semiconductor device. Unfortunately, the processes that form interconnects typically introduce mobile ions that degrade device reliability. Mobile ions, such as sodium, lithium, potassium, calcium, and magnesium, typically come from two sources: during a metal etching step and from an organic solvent typically used in removing a photoresist masking layer. The conventional wisdom of those skilled in the art is that mobile ions introduced during the metal etching steps lie only on exposed surfaces of an insulating layer or an interconnect formed during the metal etching process. A quick deionized water rinse after photoresist removal should remove virtually all of the mobile ions if they lie on exposed surfaces. Semiconductor devices that only have a deionized water rinse after photoresist removal still have unacceptably high device reliability problems.

Organic masking layer solvents include mobile ions. As used in this specification, an organic masking layer solvent is a chemical that is capable of readily removing an organic masking layer (i.e., photoresist, etc.). Examples of organic masking layer solvents include ketones (2-propanone (acetone), etc.), aliphatic hydrocarbons (n-heptane, etc.), alkali-amines (tetramethyl ammonium hydroxide, etc.), and aryl hydrocarbons (toluene, phenol, etc.). Examples of chemicals that are not organic masking layer solvents include alcohols (methanol, ethanol, 2-propanol (isopropyl alcohol), or the like) and glycols (methanediol (methylene glycol), 1,2-ethanediol (ethylene glycol), 1,2-propanediol (propylene glycol), or the like). These latter chemicals typically have at least one hydroxyl group for no more than ten carbon atoms within the molecule, wherein that hydroxyl group is directly attached to a carbon atom other than a carbon atom that is part of an aryl radical (i.e., not phenol). Although the alcohols and/or glycols may attack an organic masking layer, the rate of removing the organic masking layer typically is slow enough that it does not make the alcohols and/or glycols a chemical that readily removes an organic masking layer.

Many photoresist removal processes after a metal etching step use an organic masking layer solvent by itself or an aggregation of plasma ashing and an organic masking layer solvent. Many commercially-available organic solvents have mobile ions concentrations that are measured in parts per million. High-purity organic solvents are available that have mobile ions concentrations as low as about 10 parts per billion. However, these high purity organic solutions may still add mobile ion contamination to semiconductor devices. The cost of the organic solvents increase dramatically with higher purity.

Resist-etch-back processing sequences may also introduce mobile ions into a semiconductor device typically during a plasma etching step. Once again, mobile ions are undesired, and their concentration level in semiconductor devices should be kept as low as possible.

SUMMARY OF THE INVENTION

The present invention includes a process for forming a semiconductor device. The process of the present invention may comprise the steps of: forming a first insulating layer over a semiconductor substrate; depositing a metal-containing layer over the first insulating layer; forming a patterned organic masking layer over the metal-containing layer thereby forming exposed portions of the metal-containing layer; etching the exposed portions of the metal-containing layer with a halide-containing plasma etchant to form an interconnect member; removing the patterned organic masking layer with a plasma gas and not with an organic masking layer solvent; etching a portion of the first insulating layer with a fluoride-containing solution; and forming a second insulating layer over the interconnect member. The step of etching the portion of the first insulating layer etches at least 100 angstroms of the first insulating or removes at least 75 percent of the mobile ions from the first insulating layer. The step of etching the portion of the first insulating layer is performed after the step of etching the exposed portions and prior to forming any layer over the interconnect member; and The process of the present invention may also comprise the steps of: forming a first insulating layer over a semiconductor substrate, wherein the first insulating layer includes a high point; forming an organic layer over the first insulating layer; simultaneously etching the organic layer and high point; etching a portion of the first insulating layer to a fluoride-containing solution; and rinsing the substrate after the step of etching the portion of the first insulating layer. The step of etching the portion of the first insulating layer etches at least 100 angstroms of the first insulating layer or removes at least 75 percent of the mobile ions from the first insulating layer. The step of etching the portion of the first insulating layer is performed after the step of simultaneously etching and prior to: 1) forming any layer over the first insulating layer; or 2) annealing the substrate including the first insulating layer.

Other features and advantages of the present invention will be apparent from the accompanying drawings and from the detailed description that follows.

BRIEF DESCRIPTION OF THE DRAWINGS

The present invention is illustrated by way of example and not limited to the figures of the accompanying drawing, in which like references indicate similar elements, and in which.

DETAILED DESCRIPTION OF EMBODIMENTS

Embodiments of the present invention may be used to reduce mobile ion contamination that is introduced into a semiconductor device around the point in processing during steps of a metal etch processing sequence or a resist-etch-back processing step. Mobile ion contamination is believed to be introduced during the plasma metal etching step and during organic masking layer solvent processing for the plasma metal etching step. By eliminating the organic masking layer solvent and etching some of the insulating layer after the plasma metal etching step, mobile ion contamination introduced during the metal etch processing sequence may be substantially reduced. In resist-etch-back processing sequence, mobile ions may be introduced any time an organic layer and insulating layer are simultaneously etched. A portion of the insulating layer is etched to reduce the mobile ion concentration in the insulating layer. The present invention is better understood with the embodiments that are described below.

Interconnect Example

Figure 1:
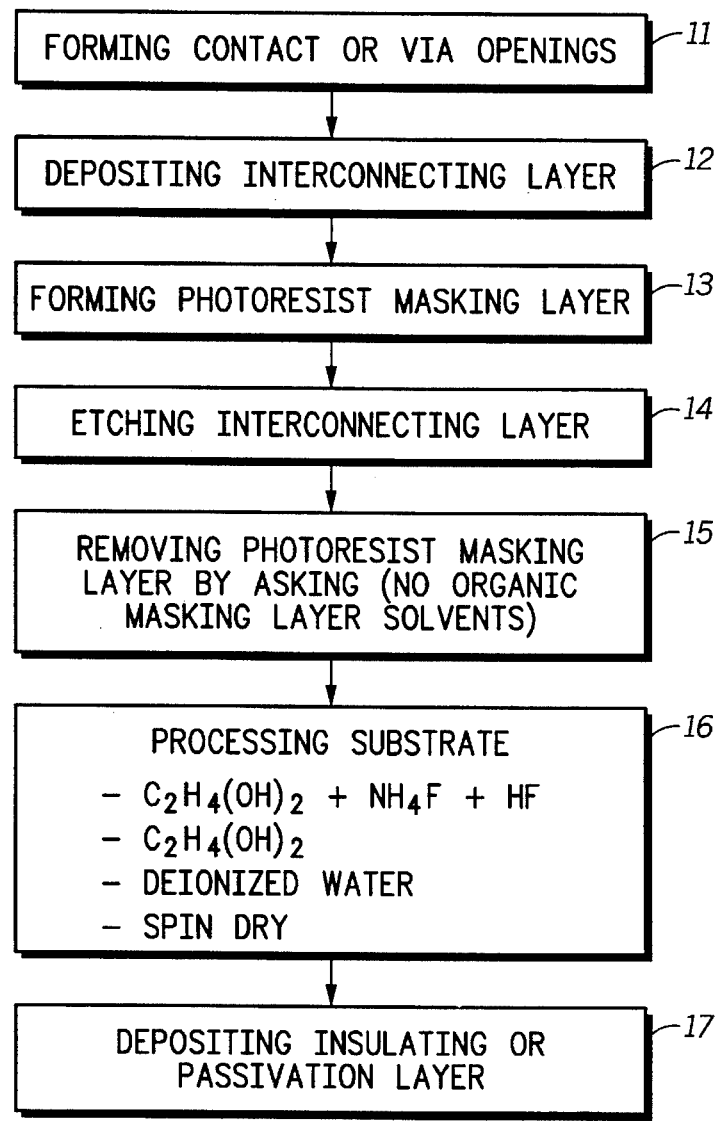
FIG. 1 includes a processing sequence of one embodiment to form a semiconductor device in accordance with the present invention.

FIG. 1 includes a processing sequence used to form a semiconductor device. The processing sequence includes the steps of: forming contact or via openings 11; depositing an interconnecting layer 12; forming a photoresist masking layer 13; selectively etching the interconnecting layer 14; removing the photoresist masking layer by ashing (no organic masking layer solvents) 15; processing the substrate 16; and depositing an insulating layer 17.

Figure 2:
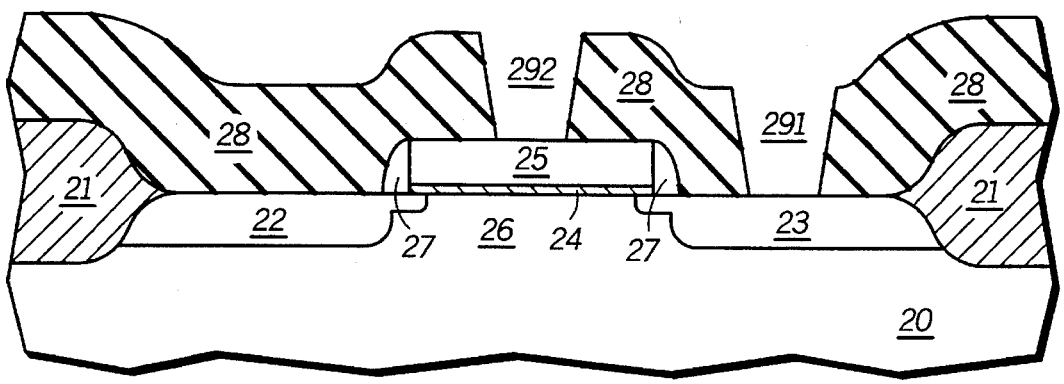
FIG. 2 includes a cross-sectional view of a portion of a substrate after forming contact openings.

FIG. 2 includes an illustration of a cross-sectional view of a portion of a semiconductor substrate 20. Field isolation regions 21, a source region 22, and a drain region 23 are formed from a part of the substrate 20 adjacent to its primary surface. The region of the substrate lying between the source and drain regions 22 and 23 and adjacent to the primary surface is a channel region 26. A gate dielectric layer 24 and a gate electrode 25 overlie the channel region 26 and a portion of the source and drain regions 22 and 23. Sidewall spacers 27 lie adjacent to the gate dielectric layer 24 and gate electrode 25, but the spacers 27 are not required. A first interlevel insulating layer 28 including silicon dioxide, borophosphosilicate glass (BPSG), phosphosilicate glass (PSG), or the like overlies the substrate 20 and includes a drain contact opening 291 and a gate contact opening 292. The first insulating layer 28 is about 8000 angstroms thick, but may be 4000–20,000 angstroms thick in other embodiments. Conventional steps are used to form the device shown at this point in the process.

Figure 3:
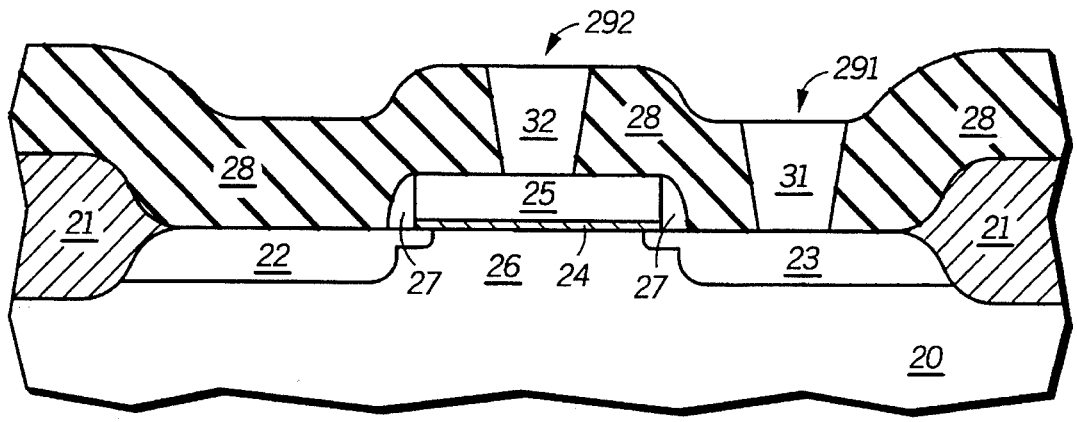
FIG. 3 includes the substrate of FIG. 2 after forming contact plugs.

A drain contact plug 31 is formed within the drain contact opening 291, and a gate contact plug 32 is formed within the gate contact opening 292 as shown in FIG. 3. The contact plugs 31 and 32 may include tungsten; titanium; tantalum; a compound of tungsten, titanium or tantalum; or various combinations of these.

Figure 4:
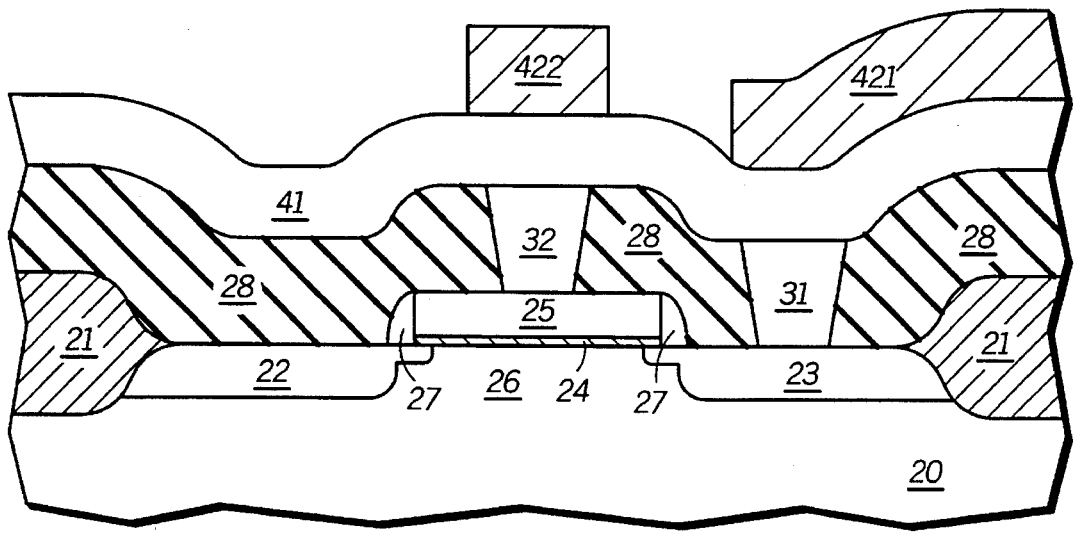
FIG. 4 includes the substrate of FIG. 3 after forming an interconnecting level and photoresist members.

An interconnecting layer 41 and photoresist members 421 and 422 are formed over the first interlevel insulating layer 28 and contact plugs 31 and 32 as shown in FIG. 4. Exposed portions of the interconnecting layer 41 are formed where the photoresist members 421 and 422 do not overlie the interconnecting layer 41. The interconnecting layer 41 is a metal-containing layer and includes aluminum, aluminum with silicon, aluminum with copper, aluminum with silicon and copper, copper, or a copper alloy. The interconnecting layer 41 has a thicknesses in a range of 4000–50,000 angstroms. In alternate embodiments, a glue or barrier layer may be part of the interconnecting layer 41 or lie under or over the interconnecting layer 41. The glue or barrier layer may include titanium nitride, a titanium tungsten, or a titanium-tantalum and have a thickness in a range of 100–3000 angstroms. In addition, an anti-reflecting coating may be a part or overlie the interconnecting layer 41. The anti-reflecting coating may include a silicon layer, titanium nitride, a titanium-tungsten alloy, or a titanium-tantalum alloy and have a thickness in a range of 50–2000 angstroms. The glue layer, barrier layer, and/or anti-reflective coating (if any of the three are present) would be formed prior to forming the photoresist members 421 and 422.

Figure 5:
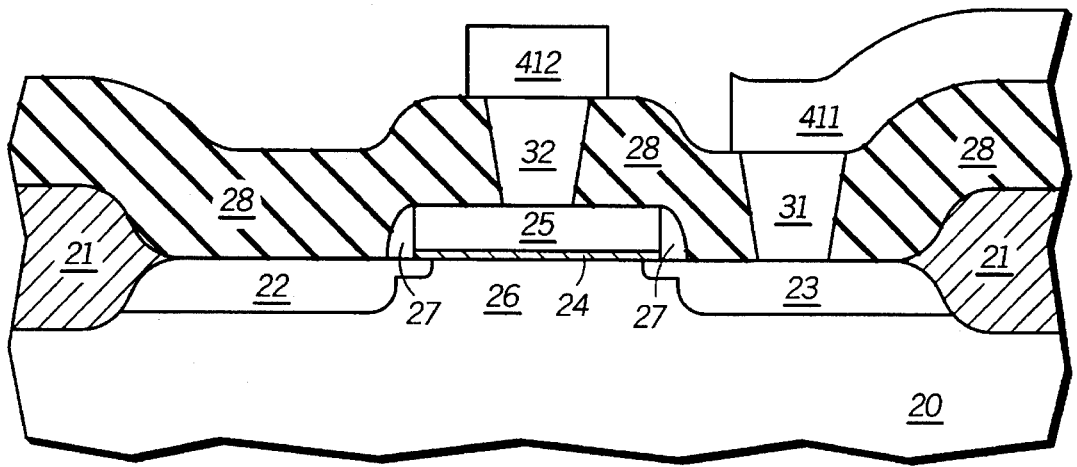
FIG. 5 includes the substrate of FIG. 4 after removing the photoresist members.

The exposed portions of the interconnecting layer 41 (as seen in FIG. 4) are etched in a plasma reactor during a plasma metal etching step to form the first drain interconnect 411 and the gate interconnect 412 as shown in FIG. 5. The plasma metal etching step may be performed in a single substrate or batch reactor using reactive ion etching (RIE), or alternately using magnetically enhanced reactive ion etching (MERIE), electron cyclotron resonance (ECR), inductively coupled plasma versions (ICP), or helicon wave (HW) systems. The plasma metal etching step includes a breakthrough or stabilization portion, a main etch portion, an endpoint portion, and an overetch portion. The process may include a chlorine gas, such as molecular chlorine, boron trichloride, carbon tetrachloride, or silicon tetrachloride, any of which may used with or without an accessory gas, such as carbon tetrafluoride, trifluoromethane, nitrogen, helium, or argon. Optionally, bromine-based etchant gases of hydrogen bromide, boron tribromide, or other bromine gases may be substituted for the chlorine gas. During the various portions of the plasma metal etching step, a halide-containing plasma (usually a chlorine-containing plasma) is formed. Ions within the plasma do the actual etching of the exposed portions of the interconnecting layer 41.

During portions of the plasma metal etching step, typical operating pressures are in a range of 15–40 millitorr (204–544 millipascals), and typical radio-frequency powers are in a range of 750–2500 watts (or alternately expressed in terms of direct-current (dc) volts, in a range of minus 125 to minus 300 volts). The length of the breakthrough portion and the main etch portion are variable due to the thickness and composition of the interconnecting layer 41. The length of the endpoint portion is sufficient to detect when at least part of the interconnecting layer 41 has been removed over the first interlevel insulating layer 28.

The overetch portion has a large effect on the implantation of mobile ions into the interlevel insulating layer 28. This is due to the interlevel insulating layer 28 being exposed to the ion bombardment of plasma ions and mobile ion contaminants within the plasma. The mobile ion contaminants typically accumulate on the plasma reactor inner surfaces as a result of etching the interconnecting layer 41 and the photoresist members 421 and 422 for this and other previously etched substrates having organic masking layers. These contaminants may become ionized during the plasma metal etching processing sequence. Typical parameters for the overetch portion utilizing batch reactors include pressures no less than 15 millitorr (204 millipascals) and no more than 40 millitorr (544 millipascals), radio-frequency power no less than 1250 watts and no more than 3000 watts, and dc bias no less then 220 volts and no more than 300 volts. The overetch portion length is highly variable. The length may range from 50–500 percent of the length of the endpoint step time, or can be expressed in terms of fixed time ranging from 100–900 seconds. In an alternate embodiment, single substrate reactors for the plasma metal etching step may be used. Other portions of the plasma metal etching step may be performed to prevent metal corrosion after the overetch portion of the plasma metal etching step.

After the plasma metal etching step, the photoresist members 421 and 422 may be removed using at least one conventional plasma ashing technique. The photoresist members 421 and 422 are substantially removed by the plasma ashing step. The photoresist members 421 and 422 are not removed in whole or in part by organic masking layer solvents. FIG. 5 is an illustration at this point in the process.

The first interlevel insulating layer 28 and interconnects 411 and 412 are rinsed with deionized water (optional), exposed to a fluoride-containing etching solution, and rinsed after being exposed to the etching solution. The etching solution typically includes hydrogen fluoride, ammonium fluoride, and a carrier solvent, such as 1,2-ethanediol. Within the etching solution, the hydrogen fluoride is in a range of 0.01–10 weight percent of the solution, ammonium fluoride is in a range of 1.0–50.0 weight percent of the solution, and 1,2-ethanediol makes up the remainder of the solution.

In alternate embodiments, alcohols or other glycols may be used. In general, the alcohols or glycols should have at least one hydroxyl group for every ten carbon atoms within the molecule, wherein that hydroxyl group is directly attached to a carbon atom other than a carbon atom that is part of an aryl radical. Further, the alcohol or glycol should be more viscous than water. The viscosity of the alcohol or glycol at 20 degrees Celsius is typically at least 2 centipoise. 1,2-ethanediol has a viscosity of about 20 centipoise at 20 degrees Celsius. The etching solution and rinsing solution are maintained at a temperature in a range of 20–50 degrees Celsius.

In another alternative embodiment, the hydrogen fluoride may be replaced by additional ammonium fluoride. In other alternate embodiments, the etching solution may include deionized water and/or carboxylic acids (such as acetic acid). The composition of the etching solution may be different when acetic acid is used compared to hydrogen fluoride. In still other embodiments, a surfactant may be included to reduce surface tension and improve the wetting properties of the solution. These wetting agents typically includes a perfluorosurfactant, a linear alkyl sulfonate, or an alkyl benzene sulfonate. For these other embodiments, the content of the components of the etching solution may vary from those previously given.

Figure 6:
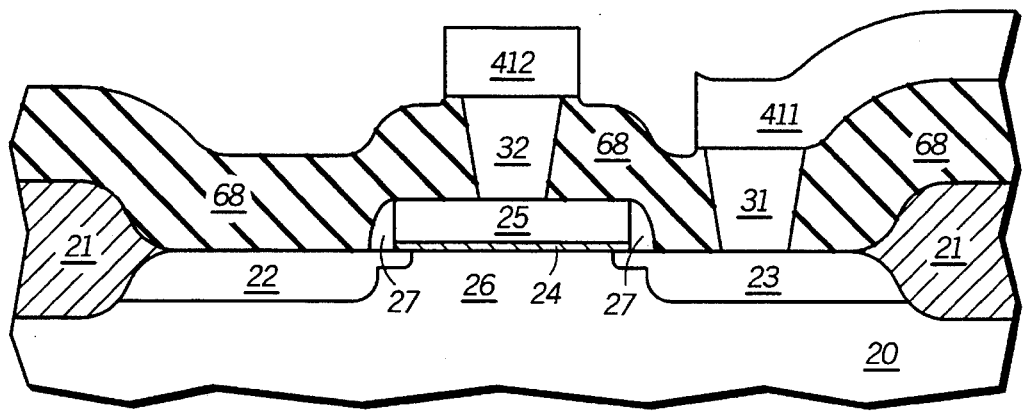
FIG. 6 includes the substrate of FIG. 5 after etching a portion of a first insulating layer after interconnects have been formed and prior to forming another layer over the first insulating layer and interconnects in accordance with the present invention.

The solution etching step is designed to etch 100–900 angstroms of the first interlevel insulating layer 28, and more typically 200–500 angstroms of first interlevel insulating layer 28. The etching produces a "cleaned" first interlevel insulating layer 68 as shown in FIG. 6. Various processing factor combinations can be used to form the cleaned first interlevel insulating layer 68. These combinations are chosen for reasons of equipment stability, process stability, control of the removal rate of the first interlevel insulating layer 28, or uniformity of the removal rate across the substrate surface. Specific details on the integration of the processing sequence to form the cleaned first interlevel insulating layer 68 may depend upon the equipment for which the processing sequence is integrated. The processing sequence may be performed in an acid hood, an acid-compatible spray tool, or a puddle processing tool. All of these pieces of equipment are known in the art, but the acid-compatible spray tool and the puddle processing tool are briefly described. The acid-compatible spray tool is similar to a spin rinse dryer (SRD) except that the acid-compatible spray tool has been modified to allow the use of acids. The puddle processing tool is a piece of equipment similar to a track used for coating photoresist onto a substrate except that the substrate is sent through at least one "puddle" of a chemical. The substrate is typically spun while it is in the puddle.

The process factors to produce the desired outputs (such as thickness of interlevel insulating layer removal and uniformity) for each equipment type are flexible. For acid hood processing, the exposure time to the etching solution is typically 60–120 seconds. The substrate cassette may or may not be agitated during this time. For the acid-compatible spray or puddle processing tool, the exposure time to the etching solution is typically 45–120 seconds. During the exposure, the substrate cassette or the substrate spin at a speed in a range of 20–75 revolutions per minute. The etching solution is fed into the acid-compatible spray tool or the puddle processing tool at a pressure in a range of 20–50 pounds per square inch (about 138–345 kilopascals) with a flow rate in a range of 0.5–2.5 gallons per minute (about 1.9–9.5 liters per minute). These factors affect the uniformity of the etching and the factors are set within these ranges to adjust for varying substrate sizes and surfaces. The temperature of the etching solution has a large effect on interlevel insulating layer removal rate and is typically 20–30 degrees Celsius.

In one embodiment, the rinsing of the substrate (after the exposure to the etching solution) may include an intermediate solvent rinse and then a deionized water rinse. The intermediate solvent rinse typically includes an alcohol or a glycol that is similar in type to the alcohol or glycol used with the etching solution. An example of the intermediate solvent includes 1,2-ethanediol. The intermediate solvent does not have to be the same solvent used in the etching solution, and therefore, the intermediate solvent may include 2-propanol, 1,2-propanediol, or the like. In alternate embodiments, the intermediate solvent may include deionized water and/or carboxylic acids (such as acetic acid). In still another embodiment, a surfactant may be included to improve the wetting of the intermediate solvent.

The solvent rinse is typically performed at a temperature in a range of 20–90 degrees Celsius. The intermediate solvent rinse time is in a range of 1–10 minutes. For the acid hood, the step may be performed in an overflow tank or quick dump rinser, with or without agitation. For the acid-compatible spray tool or the puddle processing tool, the substrate cassette or the substrate spins at a speed in a range of 25–100 revolutions per minute. For the acid-compatible spray tool or the puddle processing tool, the intermediate solvent feed pressure and flow rate are typically about the same as the etching solution. The intermediate solvent rinse is followed by a deionized water rinse. The deionized water rinse process spins at a speed in a range of 25–300 revolutions per minute and the feed pressure and flow rate are typically about the same as the etching solution.

In alternate embodiments, additional deionized water rinses may be included. For example, the substrate may be rinsed with deionized water in a quick dump rinser and then be rinsed during a portion of a spin-rinse-dry cycle.

To maximize process integration, the etch using the fluoride-containing solution, intermediate solvent rinse, deionized water rinse, and drying the substrate may be performed sequentially all in as little as one cycle when using an acid-compatible spray tool. This type of process integration reduces cycle time and operator handling.

Figure 7:
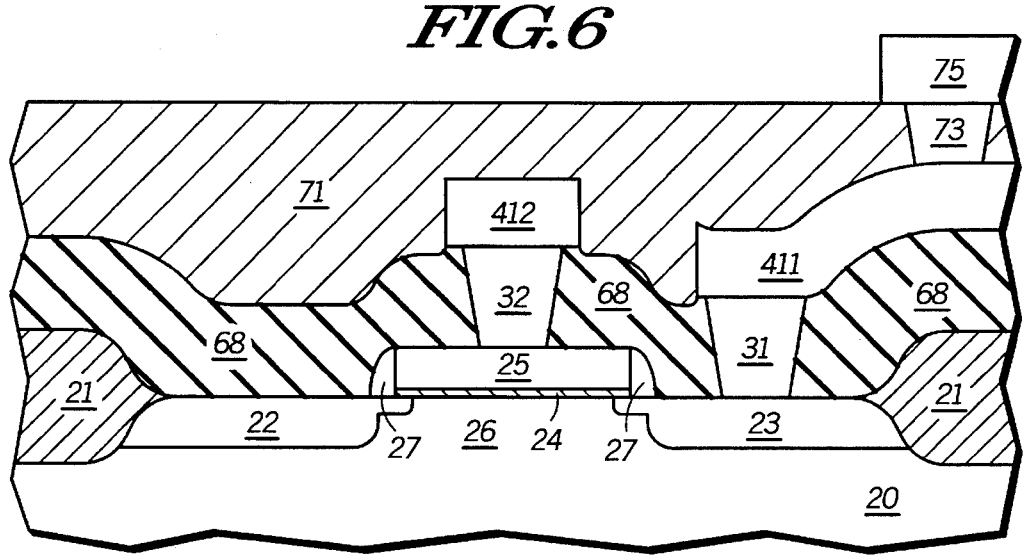
FIG. 7 includes the substrate of FIG. 6 after forming a second insulating layer, a via plug, and an interconnect.

Further processing forms a second interlevel insulating layer 71, a via plug 73, and a second-level interconnect 75 as shown in FIG. 7. The second interlevel insulating layer 71 may have the same or different composition as the first interlevel insulating layer 28 (as formed). Typically, the second interlevel insulating layer 71 includes an oxide. Although the second interlevel insulating layer 71 is illustrated to be planarized, in alternate embodiments, the second interlevel insulating layer 71 does not need to be planarized. Formation of the via plug 73, and the second-level interconnect 75 are similar to the formation of the contact plugs 31 and 32 and the interconnects 411 and 412, respectively.

Figure 8:
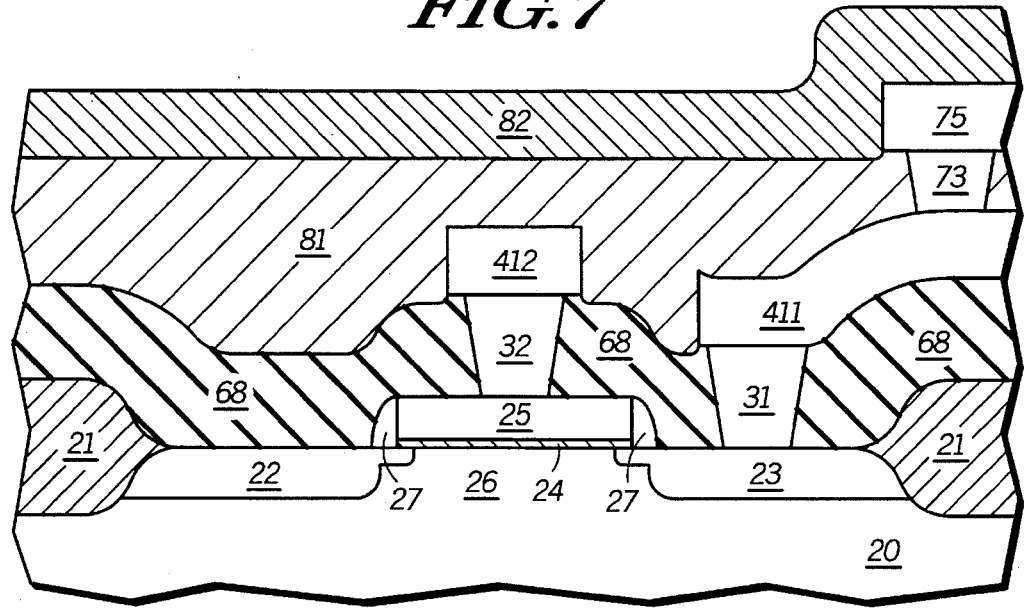
FIG. 8 includes the substrate of FIG. 7 after etching a portion of the second insulating layer and forming passivation in accordance with the present invention.

After the second-level interconnect 75 is formed, the second interlevel insulating layer 71 is processed to form a "cleaned" second interlevel insulating layer 81 as shown in FIG. 8. The processing to form the "cleaned" second interlevel insulating layer 81 uses a process meeting the criteria as described above with respect to the formation of the cleaned first interlevel insulating layer 68. Still, the process to form the cleaned second insulating layer may or may not be the same as the process to form the cleaned first interlevel insulating layer 68. A passivation layer 82, which is an insulating layer, is formed over the cleaned second interlevel insulating layer 81 and the second-level interconnect 75 to form a substantially finished device as shown in FIG. 8. Additional insulating layers, via plugs, and interconnecting layers, and other electrical connections may be made, if needed.

Figure 9:
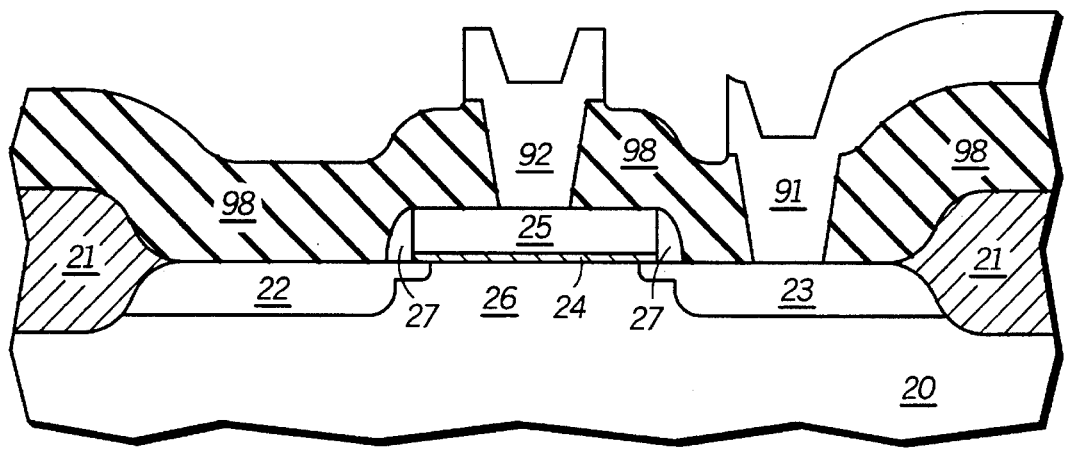
FIG. 9 includes the substrate of FIG. 2 after forming interconnects and etching a portion of the first insulating layer in accordance with the present invention.

FIG. 9 includes an illustration of a cross-sectional view of an alternate embodiment. The alternate embodiment is similar to the one shown in FIG. 5 except that the combination of contact plugs and interconnects are replaced by interconnects 91 and 92. Therefore, contact plugs are not required. Further processing is performed to form a substantially finished device. Processing with the acid hood, or acid-compatible spray tool, or puddle processing tool is done as described in previous figures to form a cleaned first interlevel insulating layer 98. Similar to the interconnects 91 and 92, the via plug 73 and second-level interconnect 75 (shown in FIG. 7) may be replaced by a single interconnect.

Resist-Etch-Back Example

Figure 10:
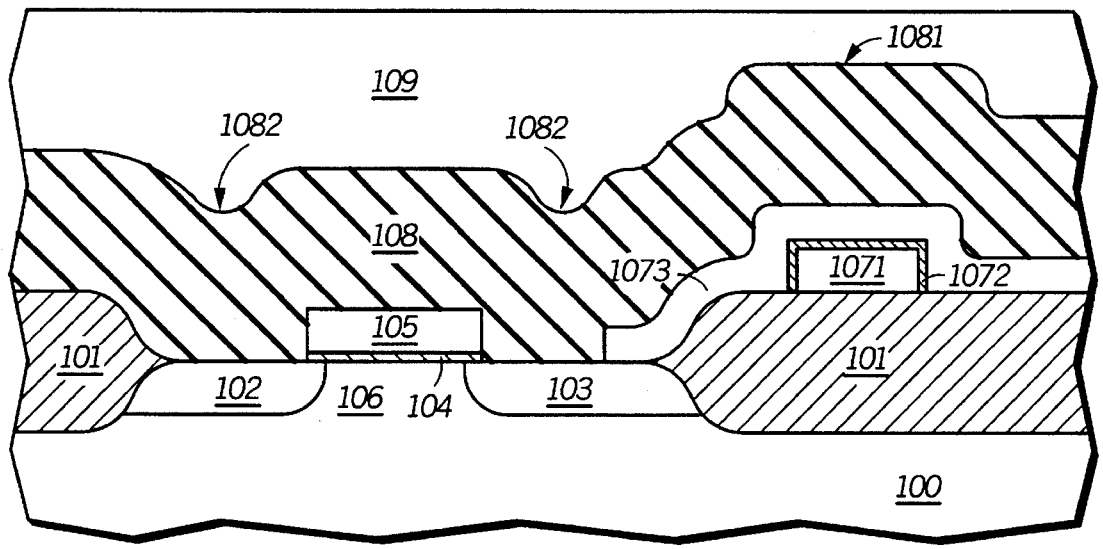
FIG. 10 includes a cross-sectional view of a portion of a substrate prior to a resist-etch-back step.

Some of the mobile ion and other device reliability problems similar to those described in the Interconnect Example may occur with a resist-etch-back process. FIG. 10 includes an illustration of a cross-sectional view of a portion of a semiconductor substrate prior to a resist-etch-back (REB) processing step. Field isolation regions 101, source region 102, drain region 103, and channel region 106 lie at least partially within the substrate 100. Gate dielectric layer 104 and gate electrode 105 overlie the channel region 106 and portions of the source and drain regions 102 and 103.

A thin-film transistor overlies one of the field isolation regions 101 and includes a gate electrode 1071, a gate dielectric layer 1072, and an active layer 1073. The active layer 1073 contacts the drain region 103. A first insulating layer 108 overlies the thin-film transistor and other portions of the substrate 100 and has a composition similar to the first insulating layer 28 described above. The first insulating layer 108 includes high point 1081 and low points 1082. The difference in elevation between the high point 1081 and low points 1082 may be more than one micron. Such a difference may cause problems with depositions of subsequent layers or lithographic steps. An REB processing sequence is typically performed to reduce the difference. The thin-film transistor may be replaced by another component, such as a metal interconnect or the like. In any event, a difference in elevation between the high and low points 1081 and 1082 of the first insulating layer 108 is too large and needs to be reduced. An organic layer 109, such as a resist layer, overlies the first insulating layer 108.

Figure 11:
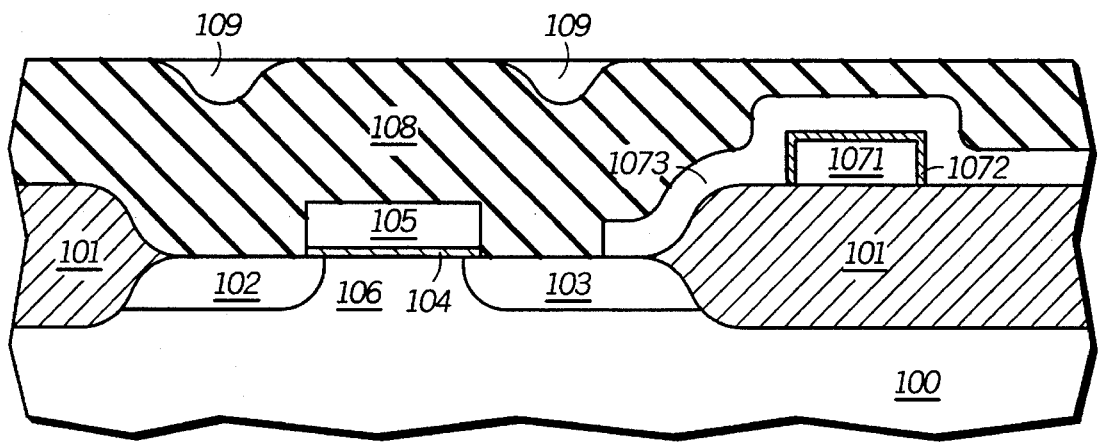
FIG. 11 includes the substrate of FIG. 10 after etching a portion of an organic layer and a first insulating layer during a resist-etch-back step.

An REB step is performed to remove at least a portion of the organic layer 109 and a portion of the first insulating layer 108 as shown in FIG. 11. The portion of the REB step in which the organic layer 109 and the first insulating layer 108 are simultaneously etched, has a large effect on the implantation of mobile ions into the first insulating layer 108. This is due to a similar effect described in relation to overetch portion of the plasma metal etching step as previously described. Typical parameters for the simultaneous etching portion of the REB step when utilizing a batch reactor include pressures no less than 30 millitorr (408 millipascals) and no more than 70 millitorr (952 millipascals), radio-frequency power no less than 800 watts and no more than 1500 watts, and dc bias in a range of minus 350 volts to minus 500 volts, and gas flow ratios of a fluorine-containing gas (such as carbon tetrafluoride, trifluoromethane or the like) and oxygen, no less than one part fluorine-containing gas to one part oxygen and no more than four parts fluorine-containing gas to one part oxygen. The length of the REB step is highly variable. The length may be in a range of 10–60 minutes. The reactor cleanliness has a large effect on mobile ion implantation due to similar effects that were previously described in with respect to the overetch portion of the plasma metal etching step. In an alternate embodiment, a single substrate reactor for the REB step may be used.

The REB etching conditions are chosen, so that the first insulating layer 108 and the organic layer 109 etch at about the same rate. The etching rate of the first insulating layer 108 should be in a range of 0.5–2.0 times the etching rate of the organic layer 109. During at least a portion of the REB step, both the first insulating layer 108 and organic layer 109 are simultaneously etched. Mobile ions are believed to become implanted into the first insulating layer 108 any time the first insulating layer 108 is exposed during the REB step. After the REB step, portions of the organic layer 109 and insulating layer 108 are present over the substrate 100. In an alternate embodiment, the thickness of the first insulating layer 108 or REB etching conditions may be changed, so that all of the organic layer 109 is removed, and the first insulating layer 108 is planar. The REB step is performed to make the surface of the first insulating layer 108 more planar and typically does not form openings within the first insulating layer 108 (i.e., not a contact or via etching step).

Any remaining portions of the organic layer 109 are removed by plasma ashing and without the use of organic masking layer solvents. In an alternate embodiment, the portions of the organic layer 109 may be removed by using organic masking layer solvents by themselves or with the plasma ashing step. The organic masking layer solvents may be used because interconnects or other layers are not exposed.

Figure 12:
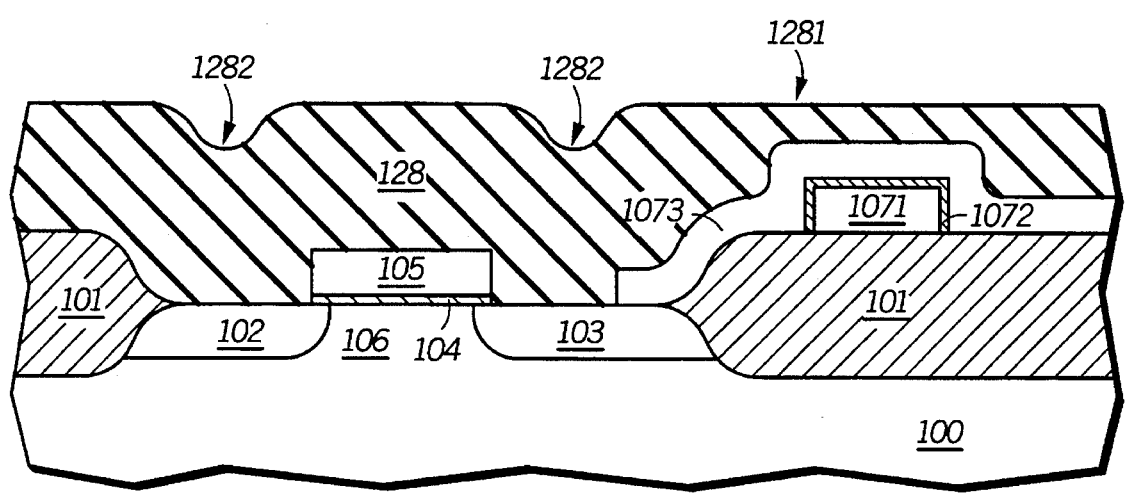
FIG. 12 includes the substrate of FIG. 11 etching a portion of a first insulating layer after the resist-etch-back step in accordance with the present invention.

The first insulating layer is "cleaned" similar to the manner previously described in reference to the first interlevel insulating layer 28 of the Interconnect Example to form a cleaned first insulating layer 128 as shown in FIG. 12 that is similar to the cleaned first interlevel insulating layer 68 as seen in FIG. 6. The cleaned first insulating layer 128 includes high point 1281 and low points 1282. In an alternate embodiment, the first insulating layer may be cleaned in a megasonic sink having a dilute fluorine-containing solution, such as 50 parts deionized water to one part hydrofluoric acid, for example. Regardless of the equipment and chemicals used, the amount of the first insulating layer removed to form the cleaned first insulating layer 128 should meet the guidelines described previously with respect to the cleaned first insulating layer 68.

The difference in elevation between the high and low points 1281 and 1282 is less than the difference in elevation between the high and low points 1081 and 1082 prior to the REB step. The difference is typically less than one micron, and more specifically is in a range of 100–3000 angstroms. The cleaning step of the REB Example is typically performed after the REB step and prior to: forming any other layer over the first insulating layer 108; annealing the substrate including the first insulating layer 108; or both.

Benefits

The embodiments of the present invention includes benefits. Mobile ions that are implanted into the insulating layer from the plasma metal etching step may be virtually eliminated by etching the surface of the insulating layer using an etching solution. The etching removes at least 75 percent of the mobile ions from the insulating layers and should remove at least 95 percent of all mobile ions from the insulating layers.

The concentration and depth of the mobile ions within an insulating layer depends on the plasma metal etching parameters that typically depend on the composition and thickness of the interconnecting layer. If any glue or barrier layers, or any anti-reflective coatings are present and etched, the plasma metal etching step may be performed under different parameters than if any of those layers are not present. Different plasma metal etching parameters may affect the concentration and depth of mobile ions within the insulating layer. The cleanliness of the plasma metal etching reactor in terms of mobile ions affects the concentration of same within the insulating layer.

As a result of the plasma etching process, organic masking layers and other polymer films incorporating mobile ions are consumed, releasing mobile ions into the plasma. The mobile ion levels within the reactor continue to increase during successive plasma metal etching cycles, causing higher concentrations of mobile ions to become implanted into an exposed insulating layer, until the interior reactor surfaces are disassembled and cleaned. Due to this accumulation, frequent disassembly and extensive cleaning of the reactor components is required, resulting in lost processing time. The embodiment of the present invention significantly reduces the frequency of cleaning required, and virtually eliminates the need for cleaning solely to reduce mobile ion concentrations within the plasma reactor.

The thickness range of the insulating layer to be removed to achieve the mobile ion reduction levels can be determined by analyzing the insulating layer after the plasma metal etching step is performed, prior to and after solution etching the insulating layer. The analysis can be performed by secondary ion mass spectrometry (SIMS) or equivalent to determine the concentration of mobile ions in the insulating layer. This technique uses an energetic beam of primary ions to sputter away secondary ions from a solid sample. Secondary ions of a given mass to charge ratio may then be plotted as a function of sputtering time. The raw data does not necessarily provide information on the ionic concentration as a function of depth. Due to the energetic effects of SIMS analysis, movement of the ions through the insulating layer occurs and this affects the ions' position during the depth profile, compared to the ions' position prior to the analysis. The total integral of the depth profile does provide mobile ion reduction information by comparison. If known thicknesses of oxide are removed by solution etching the insulating layer prior to SIMS depth profiling, the remaining fraction of the mobile ions can be measured by integration to determine the difference. Etching of oxide thicknesses less than 100 angstroms may result in less than a 75 percent reduction of mobile ions in the insulating layer. Etching of oxide thickness greater than 900 angstroms typically results in no further significant reduction in mobile ion concentration and may cause other problems that are not related to mobile ions. For most mobile ion reduction applications, between 200–500 angstroms of the insulating layer is etched with a fluoride-containing solution after the plasma metal etching step.

Benefits in mobile ion reduction occur with the REB Example, too. Any reduction in mobile ions generally improves device reliability. The amount and depth of mobile ions in the first insulating layer 108 depends on the etching parameters during the REB step. The determination of how much of the first insulating layer 108 is to be etched during the cleaning step may be performed by a SIMS analysis similar to the one described above. Removal of oxide thicknesses less than 100 angstroms may result in less than a 75 percent reduction of mobile ions in the insulating layer. Removal of oxide thickness greater than 900 angstroms typically results in no further significant reduction in mobile ion concentration and may cause other problems that are not related to mobile ions. For most mobile ion reduction applications, between 200–500 angstroms of the insulating layer are solution etched after the REB step.

Another benefit is that organic masking layer solvents are not required. Many of these organic masking layer solvents (particularly alkali-amine solvents) include mobile ions that are present at a concentration of at least 10 parts per billion. Although this is a low concentration, it is large enough to cause device reliability problems. It is believed that the mobile ions present in the solvent may attach to exposed surfaces of the interconnects that may have some residual chlorine, and can attract the mobile ions thereby increasing the mobile ion concentration in the device. High mobile ion concentrations are known to reduce device performance and reliability.

The other advantages of the embodiments of the present invention include virtually complete removal of non-ashable residues and less interconnecting layer damage. Residue removal typically requires exposure to the organic masking layer solvents, such as alkali-amine solvents, to remove these residues. With the exposure to the organic masking layer solvents, mobile ion additions to the device are almost guaranteed. The etching solution dissolves the residues, as opposed to organic masking layer solvents that break the structures into smaller parts. The etching solution (described in the embodiments above) lowers the adhesion of the residues to the interconnects. Organic masking layer solvents damage interconnects, and the damage may include pitting of the interconnect due to electrolytic dissolution and roughening of the surfaces due to grain removal. Because organic masking layer solvents are not used, the embodiments of the present invention have less damage to the surfaces of the interconnects.

The embodiments of the present invention may require less processing time and less chemicals per cycle compared to organic masking layer solvent processes. The chemicals used in the embodiments described above contain less particles and inherently cause less defectivity. This results in cleaner processing, improved device performance and yield. Separate steps of post-metal etch deionized water rinsing and chemical solution cleaning may be combined into one equipment cycle, reducing processing and staging time, and needed equipment. The use of glycol or alcohol chemicals as a carrier solvent is an advantage due to their higher viscosity than the etchant chemical. This acts as a passivant to protect the interconnect surfaces from excess exposure to the etchant chemical, preventing corrosion and other damage to the interconnects.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A process for forming a semiconductor device comprising the steps of:

forming a first insulating layer over a semiconductor substrate;

depositing a metal-containing layer over the first insulating layer;

forming a patterned organic masking layer over the metal-containing layer thereby forming exposed portions of the metal-containing layer;

etching the exposed portions of the metal-containing layer with a halide-containing plasma etchant to form an interconnect member;

removing the patterned organic masking layer with a plasma gas;

etching a portion of the first insulating layer with a fluoride-containing solution, wherein this step:
      etches at least 100 angstroms of the first insulating layer; and
      is performed after the step of etching the exposed portions and prior to forming any layer over the interconnect member; and forming a second insulating layer over the interconnect member.

2. The process of claim 1, wherein the step of etching the portion of the first insulating layer etches at least 75 percent of mobile ions from the first insulating layer.

3. The process of claim 1, wherein the fluoride-containing solution includes:

hydrogen fluoride;

ammonium fluoride; and a chemical selected from a group consisting of an alcohol and a glycol.

4. The process of claim 1, wherein the fluoride-containing solution is at a temperature in a range of 20–50 degrees Celsius.

5. The process of claim 1, wherein the step of etching the portion of the first insulating layer etches in a range of 200–500 angstroms of the first insulating layer.

6. The process of claim 1, further comprising a step of rinsing the substrate with deionized water between the steps of etching the exposed portions of the metal-containing layer and etching the portion of the first insulating layer.

7. The process of claim 1, further comprising steps of:

rinsing the substrate with a chemical selected from a group consisting of an alcohol and a glycol before rinsing the substrate with deionized water;

rinsing the substrate with deionized water; and drying the substrate, wherein the steps of rinsing the substrate with a chemical, rinsing the substrate with deionized water, and drying the substrate are performed between the steps of etching the portion of the first insulating layer and forming a second insulating layer.

8. The process of claim 7, wherein the steps of etching the portion of the first insulating layer, rinsing the substrate with the chemical, rinsing the substrate with deionized water, and drying the substrate are performed in an acid-compatible spray tool during the same cycle.

9. A process for forming a semiconductor device comprising the steps of:

forming a first insulating layer over a semiconductor substrate;

depositing a metal-containing layer over the first insulating layer;

forming a patterned organic masking layer over the metal-containing layer thereby forming exposed portions of the metal-containing layer;

etching the exposed portions of the metal-containing layer with a halide-containing plasma etchant to form an interconnect member;

removing the patterned organic masking layer with a plasma gas;

etching a portion of the first insulating layer with a fluoride-containing solution, wherein this step:
      removes at least 75 percent of mobile ions from the first insulating layer; and
      is performed after the step of etching the exposed portions and prior to forming any layer over the interconnect member; and forming a second insulating layer over the interconnect member.

10. The process of claim 9, wherein the step of etching the portion of the first insulating layer etches in a range of 200–500 angstroms of the first insulating layer.

11. The process of claim 9, wherein the fluoride-containing solution includes:

hydrogen fluoride;

ammonium fluoride; and a chemical selected from a group consisting of an alcohol and a glycol.

12. The process of claim 9, wherein the fluoride-containing solution is at a temperature in a range of 20–50 degrees Celsius.

13. The process of claim 9, further comprising a step of rinsing the substrate with deionized water between the steps of etching the exposed portions of the metal-containing layer and etching the portion of the first insulating layer.

14. The process of claim 9, further comprising steps of:
rinsing the substrate with a chemical selected from a group consisting of an alcohol and a glycol before rinsing the substrate with deionized water;
rinsing the substrate with deionized water; and
drying the substrate,
wherein the steps of rinsing the substrate with a chemical, rinsing the substrate with deionized water, and drying the substrate are performed between the steps of etching the portion of the first insulating layer and forming a second insulating layer.

15. The process of claim 14, wherein the steps of etching the portion of the first insulating layer, rinsing the substrate with the chemical, rinsing the substrate with deionized water, and drying the substrate are performed in an acid-compatible spray tool during the same cycle.

16. The process of claim 1, wherein an organic masking layer solvent is not used to remove the patterned organic masking layer.

17. The process of claim 1, wherein the fluoride-containing solution includes a carrier solvent that has a viscosity of at least 2 centipoise at 20 degrees Celsius.

18. The process of claim 7, wherein:
the fluoride-containing solution includes a carrier solvent; and
each of the carrier solvent and the chemical for rinsing the substrate has a viscosity of at least 2 centipoise at 20 degrees Celsius.

19. The process of claim 9, wherein an organic masking layer solvent is not used to remove the patterned organic masking layer.

20. The process of claim 9, wherein the fluoride-containing solution includes a carrier solvent that has a viscosity of at least 2 centipoise at 20 degrees Celsius.

21. The process of claim 14, wherein:
the fluoride-containing solution includes a carrier solvent; and
each of the carrier solvent and the chemical for rinsing the substrate has a viscosity of at least 2 centipoise at 20 degrees Celsius.

* * * * *